United States Patent [19]

Valentian

[11] Patent Number: 5,132,145
[45] Date of Patent: Jul. 21, 1992

[54] METHOD OF MAKING COMPOSITE MATERIAL CRUCIBLE FOR USE IN A DEVICE FOR MAKING SINGLE CRYSTALS

[75] Inventor: Dominique Valentian, Vernon, France

[73] Assignee: Societe Anonyme, France

[21] Appl. No.: 474,460

[22] Filed: Feb. 2, 1990

Related U.S. Application Data

[63] Continuation-in-part of Ser. No. 182,797, Apr. 18, 1988, abandoned.

[30] Foreign Application Priority Data

Apr. 27, 1987 [FR] France ............... 87 05942

[51] Int. Cl.$^5$ .............. C23C 16/30; C23C 16/40; C23C 14/36; C23C 14/32
[52] U.S. Cl. ............... 427/249; 427/255; 427/255.1; 427/255.2; 427/255.3; 204/192.16; 204/192.23; 204/192.31; 428/408; 264/62
[58] Field of Search ............ 432/262, 263, 264, 265; 422/248, 249; 427/249, 255, 255.1, 255.2, 255.3; 428/408; 204/192.16, 192.23, 192.31; 264/62

[56] References Cited

U.S. PATENT DOCUMENTS

| | | |
|---|---|---|
| 3,556,893 | 1/1971 | Ruoff . |
| 4,099,924 | 7/1978 | Berkman et al. . |
| 4,122,139 | 10/1978 | Yajima et al. ............ 264/65 |
| 4,225,569 | 9/1980 | Matsui et al. ............ 264/29.1 |
| 4,341,826 | 7/1982 | Prewo et al. . |
| 4,373,006 | 2/1983 | Galasso et al. . |
| 4,396,677 | 8/1983 | Intrater et al. . |
| 4,435,455 | 3/1984 | Preno et al. . |
| 4,472,476 | 9/1984 | Veltri et al. . |
| 4,476,178 | 10/1984 | Veltri et al. . |
| 4,500,602 | 2/1985 | Patten et al. . |
| 4,502,983 | 3/1985 | Omori et al. . |
| 4,511,612 | 4/1985 | Huther et al. . |
| 4,569,886 | 2/1986 | Divecha et al. . |
| 4,576,836 | 3/1986 | Colmet et al. . |
| 4,581,263 | 4/1986 | Lukas . |
| 4,598,024 | 7/1986 | Stinton et al. . |
| 4,618,529 | 10/1986 | Yamamura et al. . |
| 4,641,450 | 2/1987 | Moll et al. . |
| 4,657,794 | 4/1987 | Schultze et al. . |
| 4,710,435 | 12/1987 | Nakano et al. . |
| 4,748,079 | 5/1988 | Thebault ............ 428/288 |
| 4,766,013 | 8/1988 | Warren . |

FOREIGN PATENT DOCUMENTS

| | | |
|---|---|---|
| 3337630 | 4/1985 | Fed. Rep. of Germany . |
| 2329611 | 5/1977 | France . |
| 2345253 | 10/1977 | France . |
| 60-255699 | 12/1985 | Japan ............ 422/248 |
| 61-026589 | 2/1986 | Japan ............ 422/248 |
| 61-219787 | 9/1986 | Japan ............ 422/248 |
| 61-251593 | 11/1986 | Japan ............ 422/248 |
| 61-291484 | 12/1986 | Japan ............ 422/248 |

OTHER PUBLICATIONS

Brice, *Crystal Growth Processes*, (John Wiley & Sons, N.Y.) c. 1986, pp. 104–129.
European Search Report Dated Aug. 4, 1988 for Corresponding European Patent Application No. 88 40 1031
Patent Abstracts of Jan, vol. 10, No. 28, (C-326)[2085], (Rigaku Denki Yogyo K. K.) Sep. 14, 1985.

*Primary Examiner*—Shrive Beck
*Assistant Examiner*—Margaret Burke

[57] ABSTRACT

A composite material crucible for a device for making single crystals having a single layer integrally-formed cylindrical wall made of composite materials in order to simultaneously provide mechanical strength and matching of its thermal conductivity to the thermal conductivity of a molten sample. The wall has an inner lining intimately and integrally bonded thereto for providing the functions of sealing and physical and chemical compatibility with the sample, without contamination thereof. A method for manufacturing the cylindrical crucible comprising selecting a composite material wall composition including fibers made of carbon or silicon carbide, and a matrix made of carbon or silicon carbide, making from the composite material a single layer integrally-formed cylindrical wall, and depositing on the cylindrical wall an optimized material to form an inner coating which is intimately and integrally bonded to the cylindrical wall.

16 Claims, 6 Drawing Sheets

METHOD OF MAKING COMPOSITE MATERIAL CRUCIBLE FOR USE IN A DEVICE FOR MAKING SINGLE CRYSTALS

This is a continuation-in-part of copending application, Ser. No. 07/182,797, filed on Apr. 18, 1988, now abandoned.

BACKGROUND OF THE INVENTION

Oriented solidification of metals and of semiconductors may be performed on Earth or in space under microgravity.

The crucibles used to contain the materials to be melted, in particular the crucibles used in space under weightlessness, have a two-layer wall, namely an outer metal envelope providing mechanical strength, sealing, and protection against crucible defects, and a crucible per se which contains the material to be melted and which has physical and chemical characteristics which are compatible with the characteristics of the molten sample, but which has no guaranteed mechanical strength nor thermal conductivity matching, thus inducing a deformation of the heat flow lines.

The crucible per se is made from a crucible optimized material which is the best for a given sample. For example, pyrolytic boron nitride for gallium arsenide, quartz for germanium, alumina for indium antimonide. These crucible optimized materials have been selected because they give the lowest sample contamination. Unfortunately, since they are generally ceramics and/or glasses, they are brittle and prone to fracture propagation.

The presence of an outer metal envelope for the purpose of providing protection against the escape of vapor in the event of the internal crucible rupturing, contributes to deforming the heat flow lines in the sample, thereby degrading the quality of the resulting single crystal. Further, even using a double wall does not guarantee adequate mechanical strength and reliability at very high temperatures because of problems of expansion and the risk of the outer metal envelope being corroded by the sample to be melted which is often highly corrosive, particularly if it is a semiconductor. Further, some 3-5 type semiconductors (such as gallium arsenide) or 2-6 type semiconductors include components which are very toxic and which require that the entire cartridge structure should be reliable, which is difficult if the cartridge is itself constituted by a plurality of successive walls.

The present invention seeks to remedy the above-mentioned drawbacks and to provide, in particular, improved control of the melt front, thereby enabling better quality single crystals to be obtained while ensuring improved mechanical strength and reliability when hot over prior art cartridges.

SUMMARY OF THE INVENTION

These objects are achieved by means of a composite material crucible for a device for making single crystals, said crucible comprising a single layer integrally-formed cylindrical wall means made of composite materials for simultaneously providing mechanical strength and matching of its thermal conductivity to the thermal conductivity of a sample, said wall means having an inner lining means intimately and integrally bonded thereto for providing sealing and physical and chemical compatibility with said sample, without contamination thereof.

The single layer wall means may be made of carbon or silicon carbide fibers impregnated with carbon or silicon carbide.

Preferably, the inner lining means is constituted by a plurality of superposed elementary deposits comprising silicon carbide and at least one of the materials constitued by $SiO_2$, $Si_3N_4$, BN (pyrolitic boron nitride), materials made from $Si_3N_4$ and $Al_2O_3$, and borides and nitrides of transition metals ($ZrB_2$, $TiB_2$, TiN).

The inner lining means may be bonded to the wall means by one of the methods constituted by physical vapor deposition, chemical vapor deposition, vacuum evaporation, cathode sputtering and ion vapor deposition.

Thus according to the present invention an internal coating of a crucible optimized material giving the lowest sample contamination is deposited inside the crucible by such a method that it presents a thickness which is reduced to a point where the associated thermal perturbation is no longer significant. By this way, the invention; which is applicable to a crucible being either openended or blind, offers a clear advantage over previous known processes and devices where the composite structure is wound on an exiting ceramic body, which needs a thickness of several millimeters to handle the winding and densification stresses, thus forbidding to obtain the internal coatings.

The crucible according to the invention further eliminates the two walls lay out of the known crucibles and the associated thermal perturbation.

The crucible thermal conductivity may be optimized and matched to the thermal conductivity of the sample. Besides, a safe containment of the sample is provided, even at high pressure and temperature, and a protection against fracture propagation is achieved thanks to the composite structure of the wall.

The invention further relates to a method for manufacturing a cylindrical crucible for containing a molten sample to be solidified as a single crystal by one of the methods comprising the Bridgman method, the Bridgman Stockbarger method and the traveling solvent method, said method comprising the steps of:

a) selecting a composite material wall composition including fibers made of one of the materials constituted by carbon and silicon carbide, and a matrix made of one of the materials constituted by carbon and silicon carbide, to provide an integrally-formed wall having a thermal conductivity which is comprised between 5 and 200 W/m/° C. and is matched to the thermal conductivity of the sample.

b) making from said composite material wall composition a single layer integrally formed cylindrical wall having a minimum wall thickness of at least 1 mm and being adapted to safely contain molten materials providing internal pressure at service temperatures comprised between 1600° C. and 2500° C. without risk of crack propogation, c) depositing on said cylindrical wall by one of the processes including chemical vapor deposition and physical vapor deposition an optimized material to form a coating which is intimately and integrally bonded to said cylindrical wall, said inner coating having a thickness less than 2 mm and said optimized material being selected to provide sealing and physical and chemical compatibility with said sample without contamination thereof.

BRIEF DESCRIPTION OF THE DRAWINGS

An embodiment of the invention is described by way of example with reference to the accompanying drawings, in which.

MORE DETAILED DESCRIPTION

Figure 1:
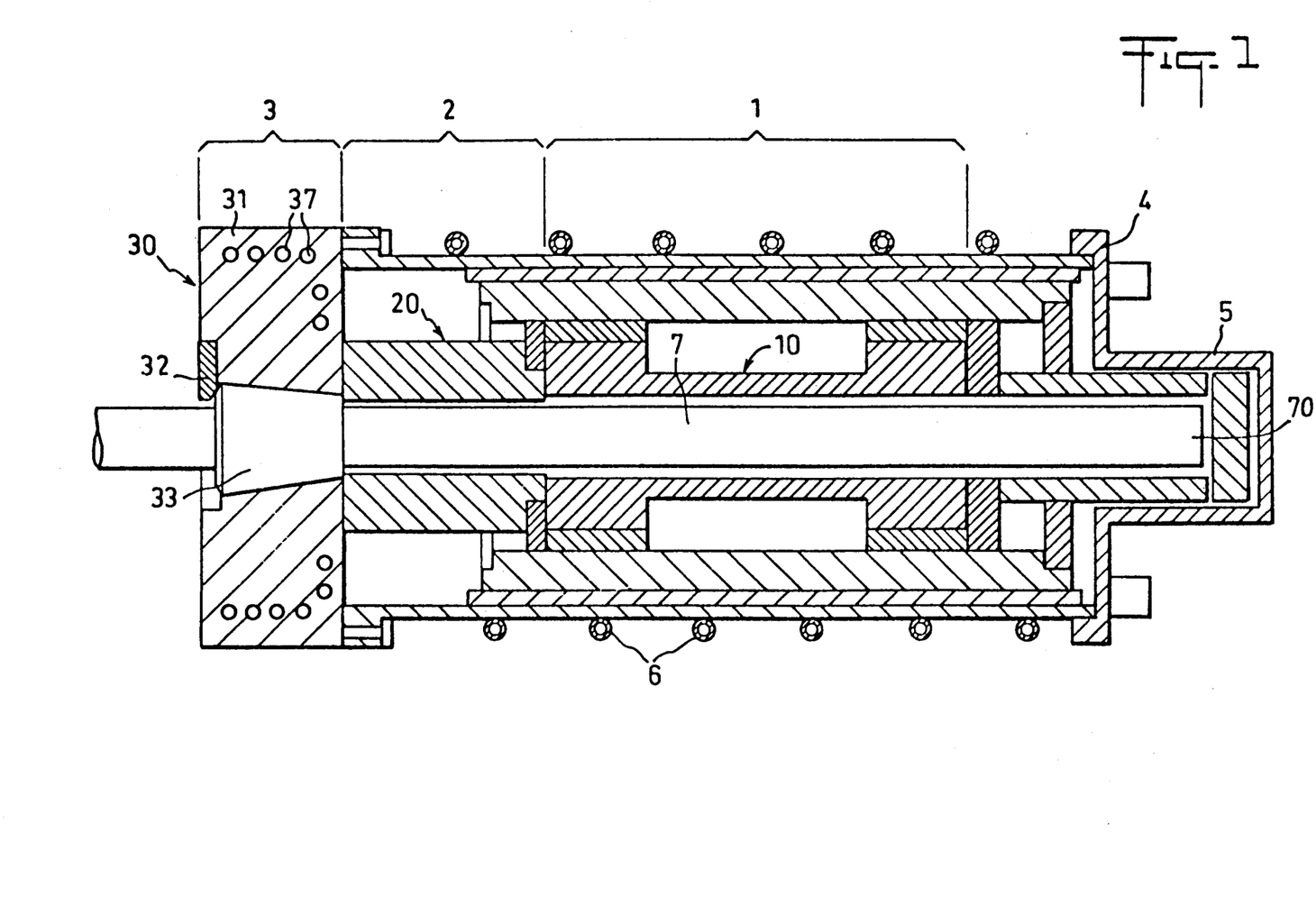
FIG. 1 is a diagrammatical axial section through an oven for crystal pulling by the Bridgman method and suitable for use with a crucible in accordance with the invention.

An example of a crystal-pulling oven suitable for making single crystalline materials and in particular semiconductors using the Bridgman method and capable of receiving crucibles such as those provided by the present invention is initially described briefly with reference to FIG. 1.

Such an oven comprises an enclosure 4 into which a crucible 7 is inserted containing the material which is to be melted and then solidified.

The oven is essentially constituted by a heating zone 1, an adiabatic zone 2, and a cooling zone 3 which extend in that order from the end 5 of the oven opposite to the end of the oven into which the crucible 7 is inserted and from which it is subsequently removed.

The heating zone 1 comprises heating means 10, for example electric means suitable for causing a heat flow to penetrate into the sample to be melted. Means 6 for cooling the outside walls of the oven are disposed around the enclosure 4 level with the heating zone 1 and the adiabatic zone 2. These cooling means may be constituted, for example, by ducts disposed helically around the enclosure 4 and having a cooling fluid running therealong.

The adiabatic zone 2 comprises a block 20 disposed around the crucible 7 and intended to confer an essentially unidirectional character to the heat flow inside the sample 9. The solidification front which constitutes the interface between the liquid phase of the sample formed in the heating zone 1 and the solid phase formed under the influence of the cooling zone 3 is situated inside the adiabatic zone 2. The planeness of the solidification front and the corresponding reduction in the quantity of defects in the single crystal produced are improved with improvement in the unidirectional character of the heat flow.

The cooling zone 3 or heat sink may be radiatively or conductively coupled to the crucible 7 and may comprise a block 31 having channels 37 therein with a cooling liquid such as water flowing in the channels. A cooling ring 33 which is frustoconical in shape and coaxial with the crucible 7 may be inserted in the cooling zone 3 inside the block 31 when the crucible 7 is inserted in the oven. A removable stop 32 then serves to fix the ring 33 inside the block 31 while the crucible 7 is being withdrawn during the pulling operation per se which serves to solidify the molten sample by controlled relative displacement of the crucible 7 relative to the heating zone 1.

The crucible 7 is essentially tubular in shape an is closed at its cold end while its other end 70 is compatible with the use of conventional volume-compensating devices (for example of the piston and spring type) which are required by the differences in density between the liquid phase and the solid phase.

Figure 2:
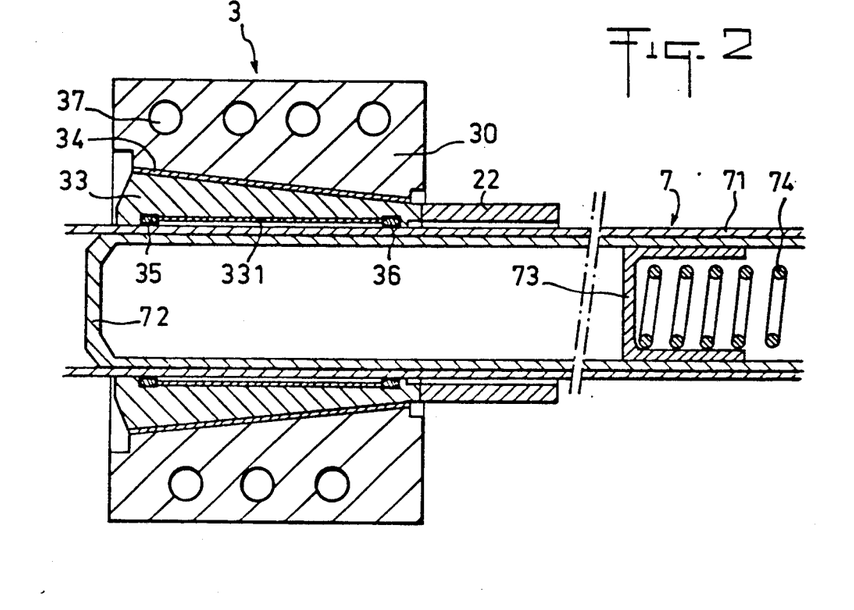
FIG. 2 is an axial section through a portion of the FIG. 1 oven in which a conventional crucible is engaged, said crucible being fitted with a set of removable parts constituted by a cooling ring and a portion of an adiabatic zone.

FIG. 2 is a more detailed view of a conventionally designed crucible 7 showing both its high temperature and provided with an expansion compensating device constituted by a piston 73 and a spring 74 made of refractory material, and also its low temperature end disposed in the body 30 of the heat sink 3.

The frustoconical cooling ring 33 inserted in the body 30 of the heat sink together with the crucible 7 defines, in conventional manner, a ring of liquid metal 331 around the crucible 7 inside an annular space delimited by two sealing rings 35 and 36 placed at opposite ends of the cooling ring 33. A heat-transmitting gasket 34 is also disposed at the junction between the body 30 and the ring 33 outside the adiabatic zone which may itself include a removable portion 22 fixed to the cooling ring 33.

In FIG. 2, it can be seen that the crucible 7 comprises an internal crucible element 72 which is in contact with the material of the sample to be melted and thus has physical and chemical characteristics which are compatible with the characteristics of the sample, and which also has thermal conductivity of the same order of magnitude as the thermal conductivity of the sample in order to limit the deformation of the lines of heat flow. This internal crucible element 72 which is matched to the sample and is made of material which is optimized to avoid contamination of the sample does not, however, guarantee any mechanical characteristics. That is why it is conventional for the crucible per se 72 to be disposed inside a tubular outer metal envelope 71 which provides mechanical strength for the crucible 7 and which provides protection against the escape of vapor in the event of the internal crucible element 72 rupturing. However, the presence of an outer metal envelope 71 contributes to deforming the lines of heat flow in the sample and thus does not make it possible to obtain a very high quality single crystal.

Figure 3:
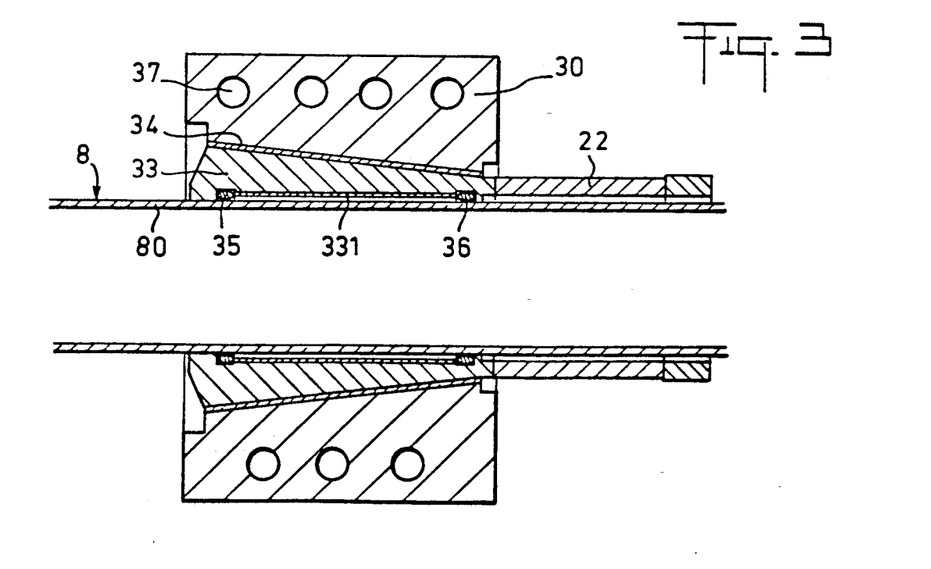
FIG. 3 is a view similar to FIG. 2, but shows a portion of the oven having a crucible in accordance with the invention received therein.

FIG. 3 shows a crucible in accordance with the present invention which has been substituted for the conventional crucible 7 inside an oven whose structure may otherwise remain identical to that of FIGS. 1 and 2. The crucible 8 in accordance with the invention has a single wall 80 made of composite material, and is thereby capable of simultaneously providing the functions of mechanical strength, sealing compatibility with the sample, and controlled thermal conductivity.

The sample to be melted is thus contained by a crucible 8 which is essentially cylindrical in shape and made of a composite material which may comprise carbon fibers, silicon carbide fibers, carbon, silicon carbide.

The thermal conductivity matching of the crucible assembly and the sample (which may be obtained exactly) avoids deformation of lines of heat flow in the sample, and therefore makes it possible to obtain a solidification front having a greater degree of planeness than in conventional equipment.

The thermal conductivity of the crucible is adjusted by acting on the texture of the composite material, the nature of the fiber used (carbon fiber or silicon carbide fiber) and the type of impregnation (gas phase or liquid phase).

For example, a carbon-carbon composite such as that sold under registered trademark SEPCARB has high thermal conductivity, whereas a silicon carbide-silicon carbide composite such as that known under registered trademark CERASEP has low thermal conductivity.

The structure of the composite material prevents crack propagation and guarantees mechanical strength when hot. The crucible 8 can thus provide a high degree of safety and good resistance to mechanical forces at high temperature (vibration, internal pressure, thermal stress) by virtue of its base structure and because of its resistance to creep and its high breaking energy.

The function of sealing the crucible 8 having a single wall 80 may be provided by an inside lining 82 which is preferably deposited on the base composite structure 81 (FIG. 5) by one of the following methods: physical vapor deposition, chemical vapor deposition, vacuum evaporation, cathode sputtering, ion vapor deposition, isostatic hot pressing, sintering or vitrification.

Figure 5:
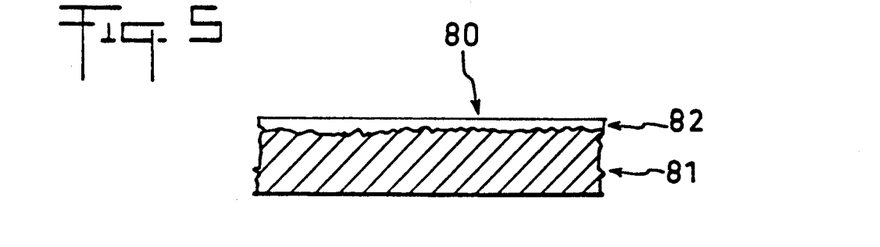
FIG. 5 is a detail view on a larger scale showing an axial section through a portion of the wall of the FIG. 3 crucible in accordance with the invention.

The sealed inner lining 82 comprises silicon carbide and may be constituted by a plurality of superposed elementary deposits. For example, the inside lining 82 may comprise the following combination of deposits: $SiC+SiO_2$, $SiC+Si_3N_4$ or $SiC+SiAlon$, where SiAlON constitutes a trademark filed by LUCAS for combinations of $Si_3N_4$ and $Al_2O_3$.

The base composite material 81 and the sealing inner lining 82 of the crucible 8 combine their properties in order to provide simultaneously improved control of the melt front, and improved strength, sealing, and reliability when hot.

The crucible 8 in accordance with the invention may cooperate with conventional volume-compensating devices required by the differences in density between the liquid phase and the solid phase of the sample. A volume-compensating device may thus be constituted by a spring and a piston analogous to items 73 and 74 shown in FIG. 2.

Figure 4:
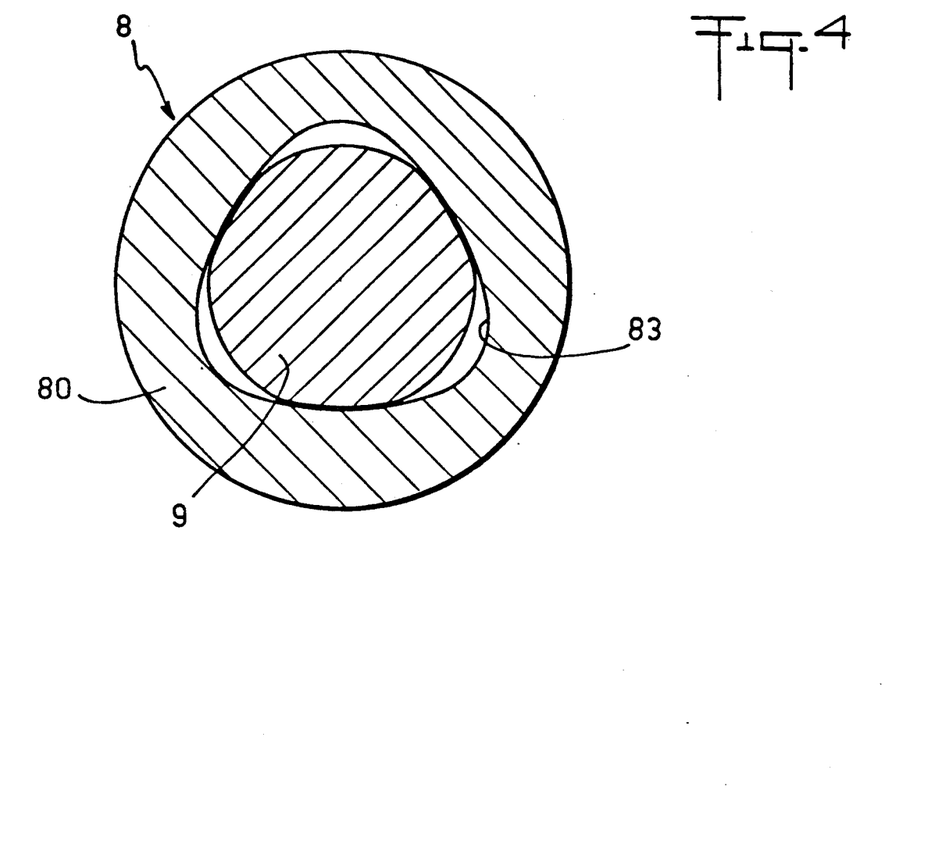
FIG. 4 is a section on a radial plane through a crucible in accordance with the present invention showing a non-circular inside section.

The structure of the crucible 8 is easily adapted to have a non-circular inside section 83 (see FIG. 4) while still providing adequate strength in the face of internal pressure. This can be used, for example, to ensure that under microgravity the liquid phase of a non-wetting molten material 9 can be confined by a surface tension gradient.

The composite crucible 8 may be used both for single direction solidification using the Bridgman method and also in vapor phase deposition. The crucible 8 is equally well suited to experiments in microgravity in space and to industrial production on Earth.

Operating temperatures for the crucible 8 may be as high as 2000° C.

More specifically a cylindrical crucible to contain a molten sample to be solidified as a single crystal, by the Bridgman method, or the Bridgman Stockbarger method, or the traveling solvent method, may have a thermal conductivity which is matched to the thermal conductivity of the sample from 5 to 200 W/m/° C. by proper selection of the wall composition including carbon fibers and/or silicon carbide fibers, a carbon and/or a silicon carbide matrix. This crucible can contain safely molten materials at service temperatures of 1600° to 2500° C. and with internal pressure without risk of crack propagation. This crucible is internally coated by CVD or PVD, this coating being made of an optimized material for a given single crystal growing (e.g. pyrolytic boron nitride for gallium arsenide). Due to its composition and reduced thickness this coating is free from the drawbacks of the bulk material i.e. crack propagation sensitivity and thermal conductivity mismatch.

Preferably the inner coating is deposited in several steps, each step being followed by grinding or polishing operations, in order to get the best possible inner surface smoothness, the last step being performed with the method giving the best possible purity in order to eliminate molten material contamination.

According to an embodiment, the single layer wall is made from carbon fibers impregnated with carbon by CVD, e.g., according to the method described in U.S. Pat. No. 4,748,079, the disclosure of which is hereby incorporated by reference, the thermal conductivity being adjustable from 50 to 200 W/m/° C. by selecting the fiber to matrix ratio from 10% to 60%, the maximum service temperature being 2500° C., the minimum wall thickness being 1.5 mm, the inner tube diameter being comprised typically between 8 and 200 mm.

According to another embodiment the single layer wall is made from carbon fibers impregnated with silicon carbide by CVD, e.g., according to the method described in U.S. Pat. No. 4,576,836, the disclosure of which is hereby incorporated by reference, the thermal conductivity being adjustable from 25 to 75 W/m/° C. by selecting the fiber to matrix ratio from 10% to 60%, the maximum service temperature being 2000° C., the minimum wall thickness being 1 mm, the inner tube diameter being comprised typically between 8 and 200 mm.

According to still another embodiment, the single layer wall is made from silicon carbide fibers impregnated with silicon carbide by CVD, e.g., according to the method described in the U.S. Pat. No. 4,576,836, the thermal conductivity being adjustable from 5 to 25 W/m/° C. by selecting the fiber to matrix ratio from 10% to 60%, the maximum service temperature being 1600° C., the minimum wall thickness being 1 mm, the inner tube diameter being comprised typically between 8 and 200 mm.

According to still another embodiment, the single layer wall is made from silicon carbide fibers impregnated with carbon and/or silicon carbide by CVD, e.g., according to the method described in the U.S. Pat. No. 4,576,836, the thermal conductivity being adjustable from 10 to 50 W/m/° C. by selecting the fiber to matrix ratio from 10% to 60% and the carbon to silicon carbide ratio from 0% to 60%, the maximum service temperature being 1600° C., the minimum wall thickness being 1 mm, the inner tube diameter being comprised typically between 8 and 200 mm.

Figure 6:
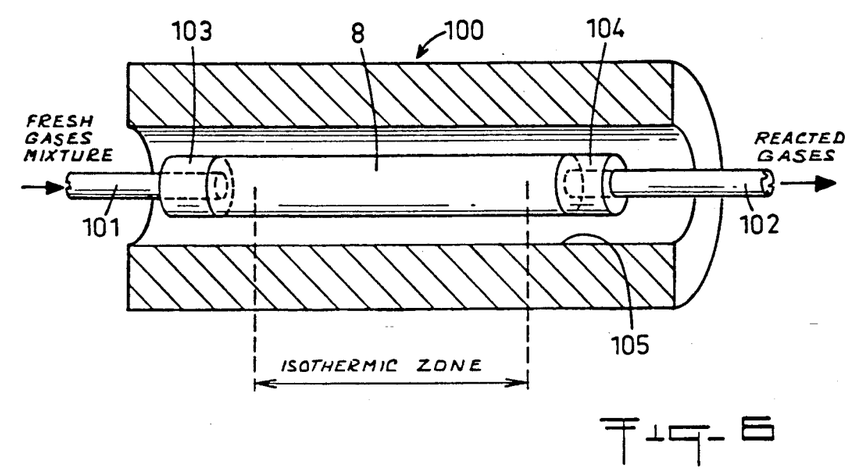
FIG. 6 is a perspective, partially broken view diagrammatically illustrating an equipment for depositing by chemical vapor deposition an inner coating on a cylindrical wall of a crucible according to a specific embodiment of the invention.

According to another aspect of the invention, which is illustrated in FIG. 6, the inner coating is deposited inside the crucible 8 by chemical vapor deposition for coating thicknesses from 1 micrometer to 2 millimeters, the crucible 8 being heated inside a furnace 100 defining a cavity 105 to provide the proper deposition temperature (between 800° and 2000° C.), the reactive fresh gas mixture being introduced inside the crucible 8 along its axis through an inlet tube 101 which is connected to a first end of the cylindrical wall of the crucible 8 by a first cylindrical glass or metal adapter 103. The reacted gases are evacuated from the crucible 8 through an outlet tube 102 which is connected to a second end of the cylindrical wall of the crucible 8 by a second cylindrical glass or metal adapter 104. The inner coating is deposited inside the crucible 8 in a deposition zone which corresponds to an isothermic zone defined by the furnace 100. This method is especially suited to form coating of amorphous carbon, silicon carbide, pyrolytic boron nitride, silicon nitride, titanium nitride.

Figure 8:
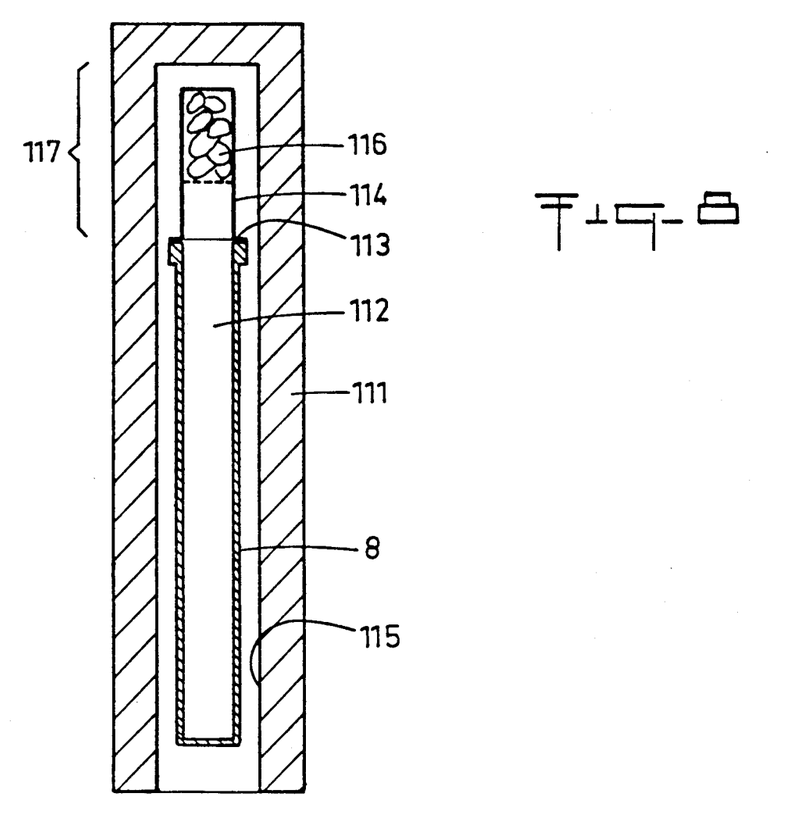
FIG. 8 is an axial section diagrammatically illustrating an equipment for depositing by physical vapor deposition an inner coating on a cylindrical wall of a crucible according to another specific embodiment of the invention.

According to another embodiment, the inner coating is deposited inside the crucible 8 by physical vapor deposition i.e., by vapor growth, vacuum evaporation, or sputtering or ion plating for coating thicknesses from 1 to 200 micrometers. The vapor growth is performed by adding to the crucible 8 a blind tube 114 containing the material 116 to be evaporated and heated in a furnace 111 (FIG. 8). As illustrated in FIG. 8, the crucible 8 is vertically arranged inside the vertical axis of a furnace cavity 115. The blind tube 114 which is closed at its upper end is sealed at its lower end to a flange 113 defined by the upper end of the crucible 8 whose lower end is closed. During the process of deposition of an inner coating inside the crucible 8, cavity 112 of the crucible 8 contains a rare gas or simply vacuum. The material 116 to be evaporated is located in the blind tube 114 above the crucible 8 in the hottest portion 117 of the furnace 111. This method is especially suited for some oxides, sulfides, antimonides, tellurides.

Figure 7:
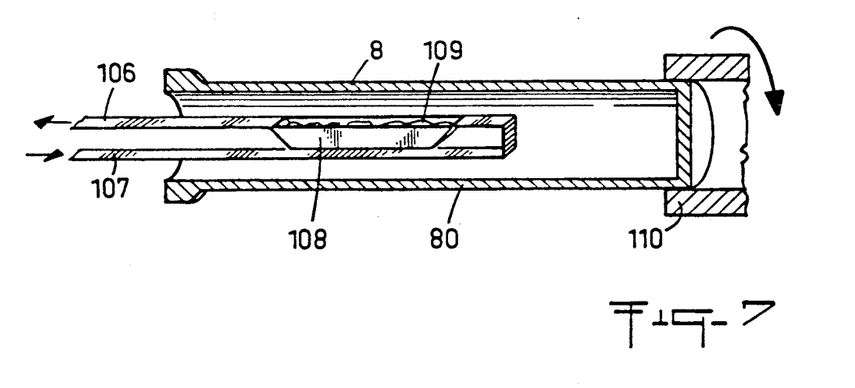
FIG. 7 is a perspective, partially broken view diagrammatically illustrating an equipment for depositing by vacuum evaporation an inner coating on a cylindrical wall of a crucible according to another specific embodiment of the invention.

According to still another embodiment illustrated in FIG. 7, the inner coating is deposited inside the crucible 8 by vacuum evaporation for coating thicknesses from 1 to 10 micrometers, the evaporation boat 108 containing the material 109 to be evaporated being introduced along the crucible axis and the crucible 8 being rotated around this axis by a rotation mechanism 110 to uniformize the thickness of the inner coating deposited on the cylindrical wall 80 of the crucible 8. The evaporation boat 108 defines a structure which is connected to current leads 106, 107 and serves as a heating resistor. This method is especially suited to form coating of silicon, silicon monoxide.

Figure 9:
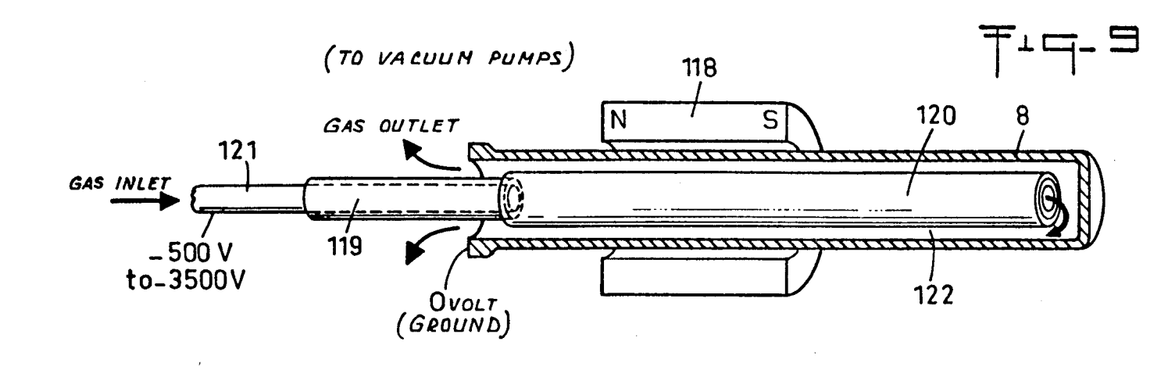
FIG. 9 is a perspective, partially broken view diagrammatically illustrating an equipment for depositing by cathode sputtering an inner coating on a cylindrical wall of a crucible according to another specific embodiment of the invention.

According to still another embodiment, which is illustrated on FIG. 9, the inner coating is deposited inside the crucible 8 by cathode sputtering (D.C., R.F. or reactive) for coating thicknesses from 1 to 10 micrometers, and the cathode is formed by an inner tube 120 coaxial to the crucible 8, biased from $-500$ V to $-3500$ V by a coaxial tubular lead 121 which is also used to supply the sputtering gas (e.g., argon or argon plus reactive gas) inside the crucible 8, a coaxial magnet 118 being optionally used to accelerate the sputtering rate. The crucible 8 is grounded, i.e., maintained at 0 volt. An insulator 119 is provided around the tubular current lead 121 near the open end of the crucible 8 to restrict discharge length. Thus a discharge appears in an area 122 between the cathode 120 which is made of the material to be evaporated and the cylindrical wall of the crucible 8, due to the high potential difference and an inner layer is deposited on the cylindrical wall of the crucible 8 by cathode sputtering. The sputtering gas supplied through the inner tube 121 used to bias the cathode 120, is delivered in the crucible cavity near the bottom wall of the crucible 8 and is evacuated in the coaxial zone situated around the insulator 119.

Figure 10:
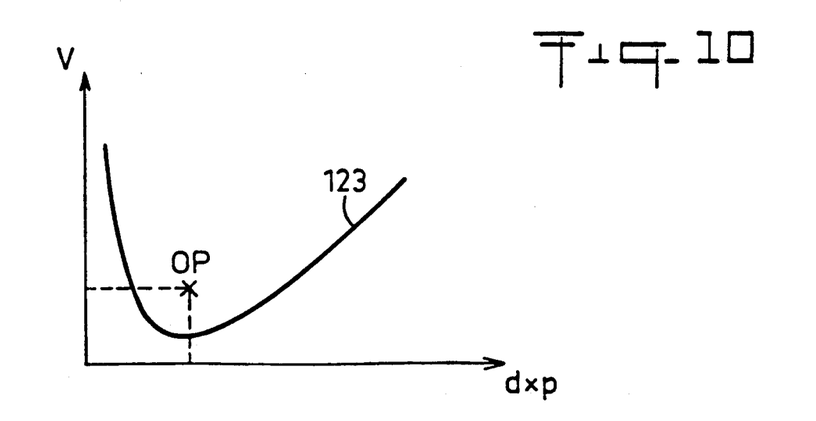
FIG. 10 is a diagramm illustrating a Paschen curve giving the boundary values of the discharge voltage V as a function of the product $d \times p$ of the interelectrode distance d by the pressure p inside the crucible when applying a cathode sputtering technique to deposit an inner coating on a cylindrical wall of a crucible according to the invention.

FIG. 10 shows the operating point OP which may be chosen to deposit the inner coating by cathode sputtering. The operating point OP is located above the Paschen curve giving limit values of the discharge voltage V as a function of the product $d \times p$ of the interelectrode distance d (i.e., the distance between cathode 120 and the crucible 8) and the pressure p inside the crucible 8 defined by the sputtering gas. This method is especially suited to form coating of titanium nitride or diboride, zirconium nitride or diboride, silicon, silicon dioxide, alumina, boron nitride.

Figure 11:
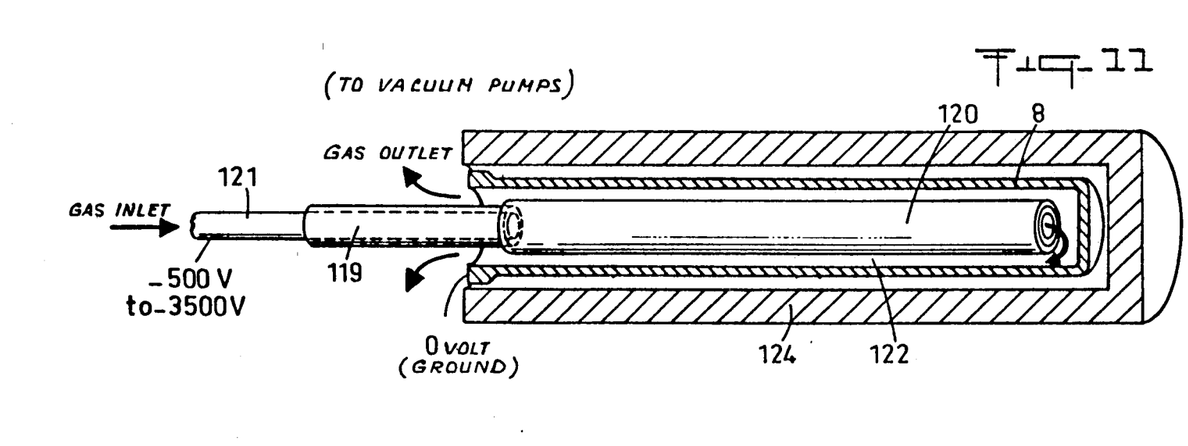
FIG. 11 is a perspective, partially broken view diagrammatically illustrating an equipment for depositing by ion plating an inner coating on a cylindrical wall of a crucible according to another specific embodiment of the invention.

According to still another embodiment which is illustrated in FIG. 11, the inner coating is deposited inside the crucible 8 by ion plating or reactive ion plating for coating thicknesses from 1 to 50 micrometers. The material to be evaporated is located in a tubular cathode 120 at the extremity of a coaxial tube 121 used to feed the sputtering gas and supply the high voltage discharge. The arrangement is similar to the arrangement shown on FIG. 9 in as much as the crucible 8 is grounded (i.e., is maintained at 0 volt) whilst the tubular current lead 121 is biased from $-500$ V to $-3500$ V and is surrounded by an insulator 109 near the open end of the crucible 8. The sputtering gas is supplied in the crucible cavity through the inner tube 121 used to bias the cathode 120 and is evacuated to vacuum pumps in the coaxial zone situated around the insulator 119. The crucible 8 is heated inside a furnace 124 to evaporate the material of the cathode 120. This method is preferably used to perform coatings of silicon or reactively grown silica or reactively grown alumina.

If we now consider the chamber temperature within the crucible during the growing process of a single crystal, the crucible may be quite isothermic. In this case the crucible has exactly the same temperature as the sample. There is no temperature gradient. The heat within the crucible may also be evacuated by the solidified portion of the grown crystal. In such a case, an axial temperature gradient appears. However, in any case the provision of a temperature gradient in a radial direction with respect to the crucible is avoided.

During the crystalline solidification of a metal or a semiconductor material, the temperature within the device for making a single crystal may be as high as 2000° C. if the crucible is made of carbon-carbon composite material and works in an inert atmosphere or under vacuum, and as high as 1500° C. if the crucible is made of SiC—SiC composite material, whatever the kind of atmosphere. In any case the chemical compatibility between the crucible and the sample material to be crystallized is achieved by the optimized material deposited inside the single layer integrally-formed cylindrical wall to form an inner lining. Thus, if for example the single crystal to be produced is gallium arsenide, the optimized material is pyrolytic boron nitride.

The thickness of the inner lining may be comprised between 1 micrometer and 2 millimeters but is preferably comprised between 1 micrometer and 250 micrometers.

I claim:

1. A method for manufacturing a cylindrical crucible for containing a molten sample to be solidified as a single crystal by one of the methods comprising the Bridgman method, the Bridgman Stockbarger method and the traveling solvent method, said method comprising the steps of:
   a) selecting a composite material wall composition including fibers made of one of the materials constituted by carbon and silicon carbide, and a matrix made of one of the materials constituted by carbon and silicon carbide, to provide an integrally-formed wall having a thermal conductivity which is comprised between 5 and 200 W/m/°C. and is matched to the thermal conductivity of the sample,
   b) making from said composite material wall composition a single layer integrally-formed cylindrical wall having a minimum wall thickness of a least 1 mm and being adapted to safely contain molten materials providing internal pressure at service temperatures comprised between 1600° C. and 2500° without risk of crack propagation, and
   c) depositing on said cylindrical wall by one of chemical vapor deposition and physical vapor deposition an optimized material to form an inner coating which is intimately and integrally bonded to said cylindrical wall, said inner coating having a thickness less than 2 mm and said optimized material being selected to provide sealing and physical and chemical compatibility with said sample without contamination thereof, said depositing step including several steps of depositing said optimized material, each of said depositing steps being followed by at least one of the operations comprising grinding and polishing to get the best possible inner surface smoothness.

2. A method according to claim 1, wherein it comprises the step of making the single layer wall from carbon fibers impregnated with carbon by CVD, the fiber to matrix ratio being chosen between 10% and 60% to adjust the thermal conductivity between 50 and 200 W/m/°C., and provide a maximu service temperature of 2500° C.

3. A method according to claim 1, wherein it comprises the step of making the single layer wall from carbon fibers impregnated with silicon carbide by CVD, the fiber to matrix ratio being chosen between 10% and 60% to adjust the thermal conductivity between 25 and 75 W/m/°C., and provide a maximum service temperature of 2000° C.

4. A method according to claim 1, wherein it comprises the step of making the single layer wall from silicon carbide fibers impregnated with silicon carbide by CVD, the fiber to matrix ratio being chosen between 10% and 60% to adjust the thermal conductivity between 5 and 25 W/m/°C. and provide a maximum service temperature of 1600° C.

5. A method according to claim 1, wherein it comprises the step of making the single layer wall from silicon carbide fibers impregnated with carbon by CVD, the fiber to matrix ratio being chosen between 10% and 60% and the carbon to silicon carbide ratio being chosen between 0% and 60% to adjust the thermal conductivity between 10 and 50 W/m/°C. and provide a maximum service temperature of 1600° C.

6. A method according to claim 1, wherein said step of depositing an inner coating comprises placing said cylindrical wall inside a furnace to provide the proper deposition temperature comprised between 800° and 2000° C. and introducing a reactive gas mixture inside said cylindrical wall along its axis for depositing said optimized material inside said cylindrical wall by chemical vapor deposition for forming a coating having a thickness comprised between 1 $\mu$m and 2 mm.

7. A method according to claim 6, wherein said optimized material is constituted by one of the following materials: amorphous carbon, silicon carbide, pyrolytic boron nitride, silicon nitride, titanium nitride.

8. A method according to claim 1, wherein said step of depositing an inner coating comprises placing said cylindrical wall inside a furnace coaxially with a blind tube containing said optimized material to be evaporated to provide deposition of said optimized material inside said cylindrical wall by vapor growth according to a physical vapor deposition technique for forming a coating having a thickness comprised between 1 $\mu$m and 200 $\mu$m.

9. A method according to claim 1, wherein said step of depositing an inner coating comprises introducing along the axis of said cylindrical wall an evaporation boat containing said optimized material to be evaporated, rotating said cylindrical wall around its axis whilst the inner coating is deposited inside said cylindrical wall by vacuum evaporation for forming a coating having a uniformized thickness comprised between 1 $\mu$m and 10 $\mu$m.

10. A method according to claim 9, wherein said optimized material is constituted by one of the following materials: silicon, silicon monoxide.

11. A method according to claim 1, wherein said step of depositing an inner coating comprises placing a cathode-forming inner tube coaxially within said cylindrical wall, biasing said cathode-forming inner tube with a voltage comprised between −500 V and −3500 V, supplying a sputtering gas within said cylindrical wall via said inner tube for depositing said optimized material inside said cylindrical wall by cathode sputtering for forming a coating having a thickness comprised between 1 $\mu$m and 10 $\mu$m.

12. A method according to claim 11, wherein said step of depositing an inner coating further comprises placing a magnet coaxially with said inner tube and said cylindrical wall to accelerate the sputtering rate.

13. A method according to claim 1, wherein said step of depositing an inner coating comprises placing inside said cylindrical wall an inner tube containing at one end thereof said optimized material to be evaporated, placing said cylindrical wall inside a furnace, supplying a sputtering gas within said cylindrical wall via said inner tube, and supplying a high voltage discharge via said inner tube for depositing said optimized material inside said cylindrical wall by ion plating for forming a coating having a thickness comprised between 1 μm and 50 μm.

14. A method according to claim 13, wherein said optimized material is constituted by one of the following materials: silicon, reactively grown silica, reactively grown alumina.

15. A method for manufacturing a cylindrical crucible for containing a molten sample to be solidified as a single crystal by one of the methods comprising the Bridgman method, the Bridgman Stockbarger method and the traveling solvent method, said method comprising the steps of:
   a) selecting a composite material wall composition including fibers made of one of the materials constituted by carbon and silicon carbide, and a matrix made of one of the materials constituted by carbon and silicon carbide, to provide an integrally-formed wall having a thermal conductivity which is comprised between 5 and 200 W/m/° C. and is matched to the thermal conductivity of the sample,
   b) making from said composite material wall composition a single layer integrally-formed cylindrical wall having a minimum wall thickness of a least 1 millimeter and being adapted to safely contain molten materials providing internal pressure at service temperatures comprised between 1600° C. and 2500° C. without risk of crack propagation, and
   c) depositing on said cylindrical wall by one of chemical vapor deposition and physical vapor deposition an optimized material to form an inner coating which is intimately and integrally bonded to said cylindrical wall, said inner coating having a thickness less than 2 millimeters and said optimized material being selected to provide sealing and physical and chemical compatibility with said sample without contamination thereof, said depositing step including placing said cylindrical wall inside a furnace coaxially with a blind tube containing said optimized material to be evaporated to provide deposition of said optimized material inside said cylindrical wall by vapor growth according to a physical vapor deposition technique for forming a coating having a thickness in a range of from about 1 micrometer to about 200 micrometers, said optimized material comprising one of the following materials: oxides, sulfides, antimonides, tellurides.

16. A method for manufacturing a cylindrical crucible for containing a molten sample to be solidified as a crystal by one of the methods comprising the Bridgmen method, the Bridgmen Stockbarger method and the traveling solvent method, said method comprising the steps of:
   a) selecting a composite material wall composition including fibers made of one of the materials constituted by carbon and silicon carbide, and a matrix made of one of the materials constituted by carbon and silicon carbide, to provide an integrally-formed wall having a thermal conductivity which is comprised between 5 and 200 W/m/°C. and is matched to the thermal conductivity of the sample,
   b) making from said composite material wall composition a single layer integrally-formed cylindrical wall having a minimum wall thickness of at least 1 millimeter and being adapted to safely contain molten materials providing internal pressure at service temperatures comprised between 1600° C. and 2500° C. without risk of crack propagation, and
   c) depositing on said cylindrical wall by one of chemical vapor deposition and physical vapor deposition an optimized material to form an inner coating which is intimately and integrally bonded to said cylindrical wall, said inner coating having a thickness less than 2 millimeters and said optimized material being selected to provide sealing and physical and chemical compatibility with said sample without contamination thereof, said depositing step including placing a cathode-forming inner tube coaxially within said cylindrical wall, biasing said cathode-forming inner tube with a voltage comprising between −500 V and −3500 V, supplying a sputtering gas within said cylindrical wall via said inner tube for depositing said optimized material inside said cylindrical wall by cathode sputtering for forming a coating having a thickness in a range of from about 1 micrometer to about 10 micrometers, said optimized material comprising one of the following materials: Titanium nitride, titanium diboride, zirconium nitride, zirconium diboride, silicon, silicon dioxide, alumina boron nitride.

* * * * *